US012456609B2

(12) United States Patent
Ikeda et al.

(10) Patent No.: US 12,456,609 B2
(45) Date of Patent: Oct. 28, 2025

(54) PLASMA PROCESSING APPARATUS

(71) Applicant: Tokyo Electron Limited, Tokyo (JP)

(72) Inventors: Taro Ikeda, Nirasaki (JP); Satoru Kawakami, Nirasaki (JP); Kenta Kato, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 637 days.

(21) Appl. No.: 17/872,560

(22) Filed: Jul. 25, 2022

(65) Prior Publication Data

US 2023/0031447 A1 Feb. 2, 2023

(30) Foreign Application Priority Data

Jul. 30, 2021 (JP) ................................ 2021-126055

(51) Int. Cl.
*H01J 37/32* (2006.01)

(52) U.S. Cl.
CPC .... *H01J 37/3244* (2013.01); *H01J 37/32238* (2013.01); *H01J 37/32247* (2013.01)

(58) Field of Classification Search
CPC ............ H01J 37/3244; H01J 37/32238; H01J 37/32247
See application file for complete search history.

(56) References Cited

U.S. PATENT DOCUMENTS 5,698,036 A * 12/1997 Ishii ................. H01J 37/32229 118/723 MP

FOREIGN PATENT DOCUMENTS

| | | | |
|---|---|---|---|
| JP | H11-162957 | A | 6/1999 |
| JP | H11-204295 | A | 7/1999 |
| JP | 2020-092033 | A | 6/2020 |
| KR | 10-0270425 | B1 | 12/2000 |
| KR | 1020150050539 | A | 5/2015 |

* cited by examiner

*Primary Examiner* — Yuechaun Yu
(74) *Attorney, Agent, or Firm* — Nath, Goldberg & Meyer; Jerald L. Meyer; Tanya E. Harkins

(57) ABSTRACT

A plasma processing apparatus includes: a processing container including a substrate support; a shower head that supplies active species of a first gas into the processing container; a first dissociation space through which the active species is supplied to the shower head; and a resonator that supplies electromagnetic waves in a VHF band or higher to the first dissociation space. The resonator includes: a cylindrical body; a gas pipe which passes through an interior of the cylindrical body, is provided along a central axis direction of the cylindrical body, and includes gas holes through which the first gas is supplied into the first dissociation space; and a dielectric window including a central portion through which the end portion of the gas pipe passes, and configured to seal a space between the gas pipe and the cylindrical body and cause the electromagnetic waves to transmit through the first dissociation space.

20 Claims, 4 Drawing Sheets

PLASMA PROCESSING APPARATUS

CROSS-REFERENCE TO RELATED APPLICATION

This application is based upon and claims the benefit of priority from Japanese Patent Application No. 2021-126055, filed on Jul. 30, 2021, the entire contents of which are incorporated herein by reference.

TECHNICAL FIELD

The present disclosure relates to a plasma processing apparatus.

BACKGROUND

Patent Document 1 discloses a plasma CVD apparatus including a plasma generation chamber provided between a radio-frequency application electrode and an intermediate mesh plate electrode for plasma separation, which are parallel to each other, and a counter electrode located outside the plasma generation chamber and having a substrate installed in parallel with the intermediate mesh plate electrode. In Patent Document 1, the intermediate mesh plate electrode is movable in both directions oriented to the counter electrode side and the radio-frequency application electrode side, and is capable of applying radio-frequency waves to the counter electrode.

Patent Document 2 discloses a plasma processing apparatus that introduces VHF waves and generates plasma from a gas by the VHF waves. In Patent Document 2, an upper electrode and a lower electrode include recesses formed in the surfaces thereof facing each other. An upper dielectric and a lower dielectric are provided in the recesses of the upper electrode and the lower electrode, respectively. A VHF wave introduction part is provided at a lateral end portion of a space between the upper dielectric and the lower dielectric.

Patent Document 3 discloses a plasma processing apparatus that introduces microwaves and generates plasma from a gas by the microwaves.

PRIOR ART DOCUMENTS

Patent Documents

Patent Document 1: Japanese Laid-Open Patent Publication No. H11-162957

Patent Document 2: Japanese Laid-Open Patent Publication No. 2020-092033

Patent Document 3: Japanese Laid-Open Patent Publication No. H11-204295

SUMMARY

According to an aspect of the present disclosure, there is provided a plasma processing apparatus including: a processing container including a substrate support provided therein; a shower head configured to supply active species of a first gas into the processing container; a first dissociation space configured such that the active species of the first gas is supplied to the shower head; and a resonator configured to supply electromagnetic waves in a VHF band or higher to the first dissociation space, wherein the resonator includes: a cylindrical body that constitutes a housing of the resonator; a gas pipe which passes through an interior of the cylindrical body, is provided along a central axis direction of the cylindrical body, includes a plurality of gas holes formed in an end portion of the gas pipe, and is configured to supply the first gas into the first dissociation space through the plurality of gas holes; and a dielectric window including a central portion through which the end portion of the gas pipe passes, and configured to seal a space between the gas pipe and the cylindrical body and cause the electromagnetic waves to transmit through the first dissociation space.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
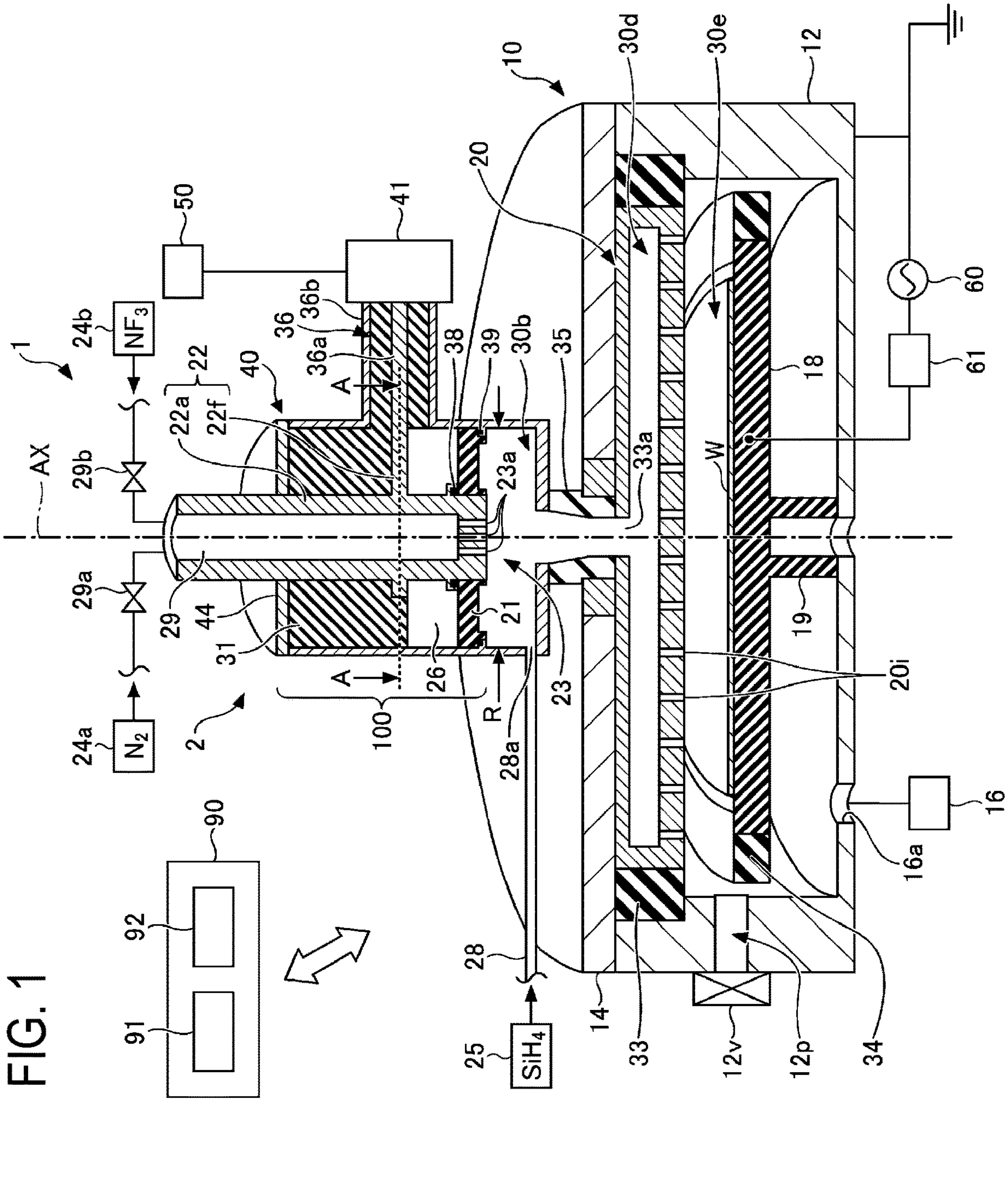
FIG. 1 is a schematic cross-sectional view illustrating an example of a plasma processing apparatus according to an embodiment.

Hereinafter, embodiments of the present disclosure will be described with reference to the accompanying drawings. In each of the drawings, the same components are denoted by the same reference numerals, and redundant descriptions may be omitted. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

[Plasma Processing Apparatus]

Hereinafter, a plasma processing apparatus according to an embodiment will be described in detail with reference to the drawings. It is conceivable to increase the frequency as a means to improve the performance of the plasma processing apparatus. In this case, it is conceivable to use electromagnetic waves in the VHF band, which are higher in frequency than general radio-frequency waves (e.g., 13.56 MHz), or higher. For example, the frequency of electromagnetic waves in the VHF band is 30 MHz to 300 MHz, and the frequency of electromagnetic waves in the UHF band is 300 MHz to 3 GHz. By having higher frequencies than general radio-frequency waves, the electromagnetic waves in the VHF band and UHF band are capable of controlling the dissociation of a gas, which is difficult to dissociate with normal radio-frequency waves, to be highly dissociated, and are capable of enhancing the performance of the plasma processing apparatus. However, when electromagnetic waves in the VHF band and UHF band are applied into a chamber, the wavelengths of these electromagnetic waves become shorter than normal radio-frequency waves, which may result in poor plasma uniformity and cause processes, such as film formation and etching, to be non-uniform.

In a plasma processing apparatus 1 described below, as illustrated in FIG. 1, a first dissociation space 30*b* is provided in a gas activator 2 separately from a second dissociation space 30*e* which is a process space inside a chamber 10. Both the first dissociation space 30*b* and the second dissociation space 30*e* are plasma generation spaces. As a result, a first gas supplied to the first dissociation space 30*b* is dissociated by using electromagnetic waves in the VHF band or higher, active species of the first gas are supplied into the chamber 10, and the active species of the first gas are additionally plasmarized in the second dissociation space 30*e*. As a result, even when the electromagnetic waves in the VHF band and the UHF band are used, it is possible to achieve uniformity of the plasma by using the gas activator 2. The chamber 10 is an example of a processing container.

Figure 2:
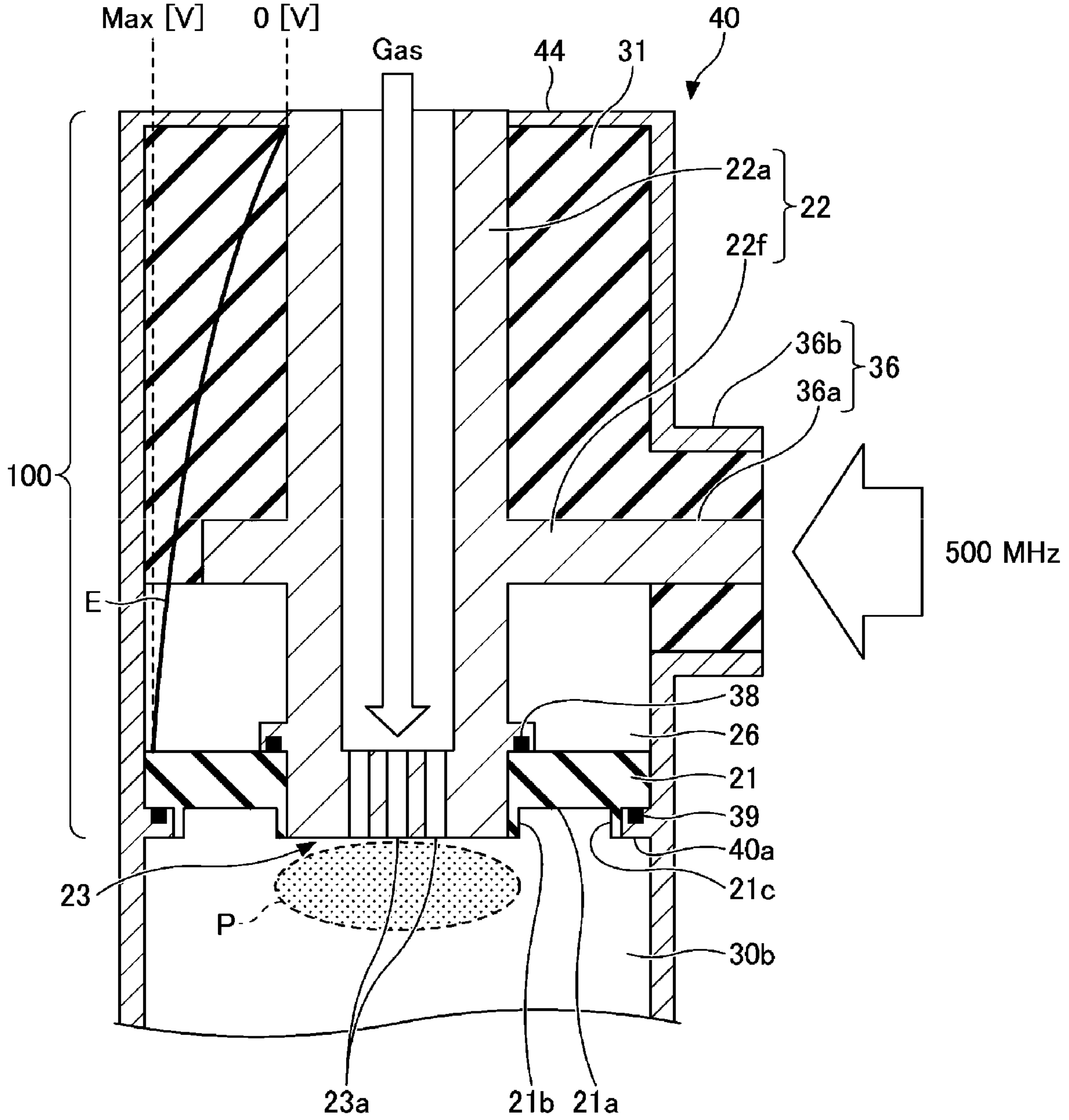
FIG. 2 is a schematic cross-sectional view illustrating an example of a resonance part according to an embodiment.
Figure 3:
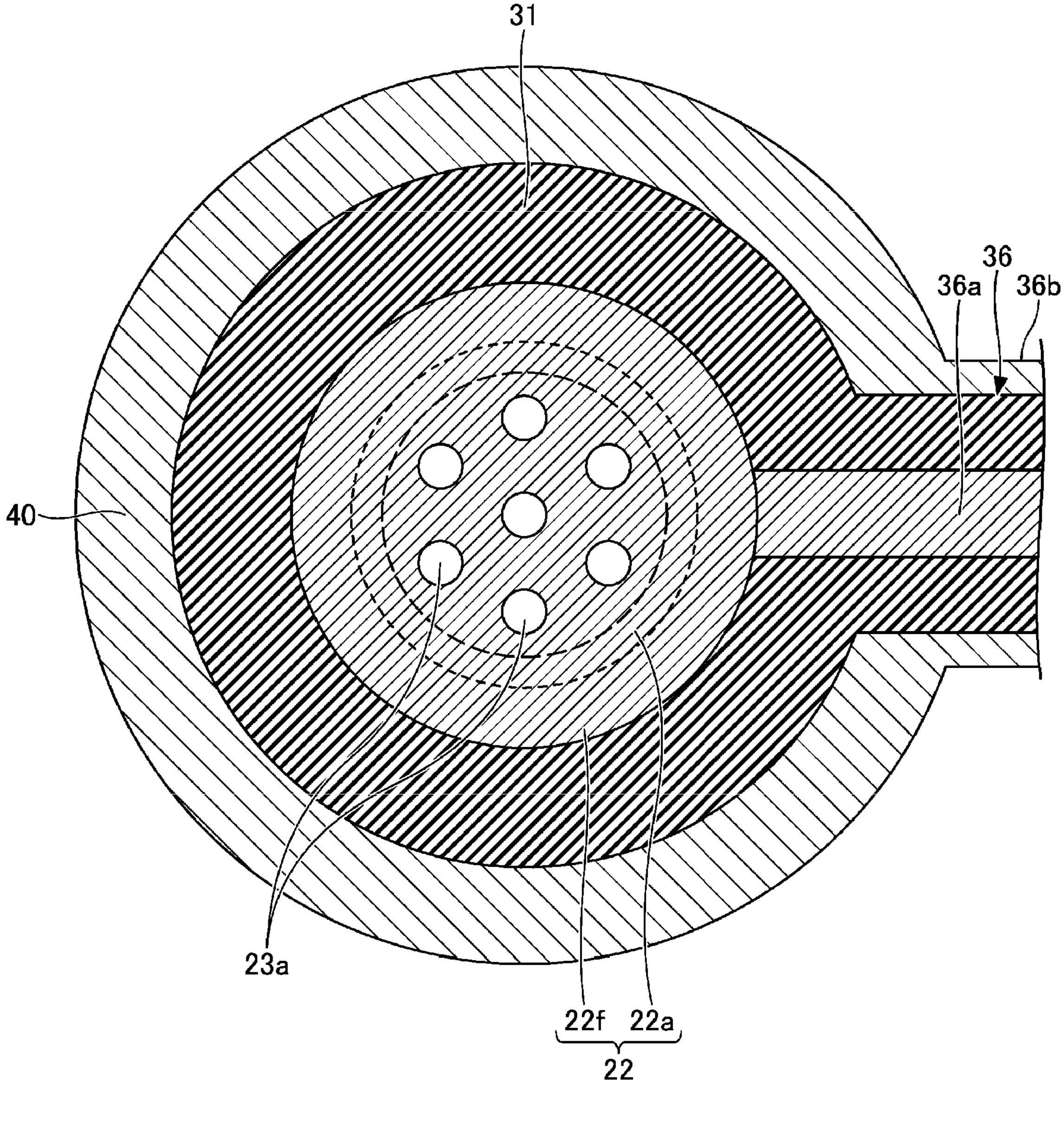
FIG. 3 is a cross-sectional view taken along line A-A of FIG. 1.

The plasma processing apparatus 1 according to an embodiment will be described with reference to FIGS. 1 to 3. FIG. 1 is a schematic cross-sectional view illustrating an example of the plasma processing apparatus according to an embodiment. FIG. 2 is a schematic cross-sectional view illustrating an example of a resonance part according to an embodiment. FIG. 3 is a cross-sectional view taken along line A-A of FIG. 1.

The plasma processing apparatus 1 illustrated in FIG. 1 includes the chamber 10 and the gas activator 2. The plasma processing apparatus 1 is configured to generate plasma from a gas by electromagnetic waves in the VHF band or higher inside the gas activator 2. In addition, the plasma processing apparatus 1 is configured to generate plasma inside the chamber 10 from a gas by radio-frequency waves having a frequency lower than the frequency of electromagnetic waves in the VHF band or higher. The electromagnetic waves may be in the VHF band or higher, but are preferably in the UHF band or higher, and the upper limit of the frequency of the electromagnetic waves may be the same as the upper limit of that of the UHF band. The chamber 10 has an axis line AX as its central axis line. The axis line AX is an axis line extending in the vertical direction. A substrate W is processed inside the chamber 10.

In an embodiment, the chamber 10 may include a chamber main body 12. The chamber main body 12 includes a cylindrical body to provide a sidewall and a bottom wall of the chamber 10. An upper portion of the chamber main body 12 is open. The chamber main body 12 is made of a metal such as aluminum. The chamber main body 12 is grounded.

The sidewall of the chamber main body 12 provides a passage 12*p*. The substrate W passes through the passage 12*p* when being transferred between the exterior and the interior of the chamber 10. The passage 12*p* is openable/closable by a gate valve 12*v*. The gate valve 12*v* is provided along the sidewall of the chamber main body 12.

The chamber 10 may further include an upper wall 14. The upper wall 14 is made of a metal such as aluminum. The upper wall 14 has a disk-shape and closes the opening of the upper portion of the chamber main body 12. The upper wall 14 is grounded together with the chamber main body 12.

The bottom wall of the chamber 10 provides an exhaust port 16*a*. The exhaust port 16*a* is connected to an exhaust device 16. The exhaust device 16 includes a pressure controller, such as an automatic pressure control valve, and a vacuum pump, such as a turbo molecular pump.

The plasma processing apparatus 1 further includes a substrate support 18. The substrate support 18 is provided inside the chamber 10. The substrate support 18 is configured to support the substrate W placed thereon. The substrate W is placed on the substrate support 18 in a substantially horizontal state. The substrate support 18 may be supported by a support member 19. The support member 19 extends upward from the bottom of the chamber 10. The substrate support 18 and the support member 19 may be formed of a dielectric material such as aluminum nitride.

The plasma processing apparatus 1 further includes a shower head 20. The shower head 20 is made of a metal such as aluminum. The shower head 20 is formed in a substantially disk-shape and has a hollow structure. The shower head 20 shares the axis line AX as the central axis line thereof. The shower head 20 is provided above the substrate support 18 and below the upper wall 14. The shower head 20 constitutes a ceiling that defines an internal space of the chamber 10, and the upper wall 14 is provided above the ceiling.

The shower head 20 includes a diffusion chamber 30*d* provided therein. The shower head 20 is provided with a plurality of gas holes 20*i* that vertically penetrate the shower head from the diffusion chamber 30*d*. The plurality of gas holes 20*i* are open on the bottom surface of the shower head 20. A gas is introduced toward the second dissociation space 30*e* between the shower head 20 and the substrate support 18 inside the chamber 10.

As a result, the shower head 20 introduces the active species of the first gas, which will be described later, from the diffusion chamber 30*d* into the second dissociation space 30*e* through the plurality of gas holes 20*i*. In addition, the shower head 20 introduces a second gas, which will be described later, from the diffusion chamber 30*d* into the second dissociation space 30*e* through the plurality of gas holes 20*i*.

A diameter of each gas hole 20*i* of the shower head 20 may be about 1 mm. When the diameter is 1 mm or less, the collision frequency between the active species of the first gas inside the gas hole 20*i* becomes high. When the diameter of each gas hole 20*i* set to about 1 mm, it is possible to reduce the probability of the active species of the first gas returning to the first gas before reaching the second dissociation space 30*e*.

An outer periphery of the shower head 20 is covered with a dielectric member 33 such as ceramic. An outer periphery of the substrate support 18 is covered with a dielectric member 34 such as ceramic. When radio-frequency waves are not applied to the shower head 20, the dielectric member 33 may be omitted. However, it is better to dispose the dielectric member 33 in order to define the region of the shower head 20 that functions as a counter electrode of the substrate support 18. Further, in order to make a ratio of the anode to the cathode of the electrode as uniform as possible, it is better to dispose the dielectric member 33.

A radio-frequency power supply 60 is connected to the substrate support 18 via a matcher 61. The matcher 61 includes an impedance matching circuit. The impedance matching circuit is configured to match an impedance of a load of the radio-frequency power supply 60 with an output impedance of the radio-frequency power supply 60. A frequency of the radio-frequency waves supplied from the radio-frequency power supply 60 is lower than that of the VHF waves supplied from the power supply 50, and is 60 MHz or less. An example of the frequency of the high-frequency waves may be 13.56 MHz. The radio-frequency power supply 60 may apply radio-frequency waves to the shower head 20.

A controller (control device) 90 may be a computer provided with a processor 91 and a memory 92. The controller 90 includes a calculator, a storage, an input device, a display device, a signal input/output interface, and the like. The controller 90 controls each part of the plasma processing apparatus 1 including the gas activator 2. In the controller 90, an operator may perform a command input operation or the like in order to manage the plasma processing apparatus 1 by using the input device. In addition, in the controller 90, an operation status of the plasma processing apparatus 1 may be visually displayed by the display device. In addition, a control program and recipe data are stored in the memory 92 of the controller 90. The control program is executed by the processor 91 of the controller 90 in order to execute various processes in the plasma processing apparatus 1. The processor 91 executes the control program and controls each part of the plasma processing apparatus 1 according to the recipe data, so that various processes, for example, a plasma processing method, are executed in the plasma processing apparatus 1.

The gas activator 2 includes a resonator 100 and the first dissociation space 30*b*.

(Resonator: Cylindrical Body)

The resonator 100 includes a cylindrical body 40 that constitutes a housing of the resonator 100. The cylindrical body 40 is formed of a metal such as aluminum and has a hollow structure. The cylindrical body 40 shares an axis line AX as its central axis line. A lower end of the gas activator 2 is fixed to the insulating member 35 on the upper wall 14 of the chamber 10. The insulating member 35 is formed of ceramic such as aluminum nitride, has a hollow structure, is inserted into a hole formed in the central portion of the upper wall 14, and is brought into contact with an upper surface around a through-hole penetrating the upper center of the shower head 20 to communicate with the diffusion chamber 30*d*. As a result, the gas activator 2 and the chamber 10 are insulated from each other.

An upper end of the cylindrical body 40 is closed by a disk-shaped cover conductor 44 having the same diameter as the outer diameter of the cylindrical body 40. The cover conductor 44 is formed of a metal such as aluminum.

(Resonator: Gas Pipe)

The resonator 100 further includes a gas pipe 22. The gas pipe 22 is a pipe of the cylindrical body. The gas pipe 22 passes through the interior of the cylindrical body 40, is provided along a central axis direction of the cylindrical body 40, and includes a plurality of gas holes 23*a* formed in an end portion thereof. The gas pipe 22 includes a vertical portion 22*a* and a flange portion 22*f*. The vertical portion 22*a* and the flange portion 22*f* are formed of a metal such as aluminum. The vertical portion 22*a* penetrates the cover conductor 44 and is disposed in the center of the resonator 100. That is, the vertical portion 22*a* and the cylindrical body 40 share the axis line AX as the central axis line thereof. The vertical portion 22*a* is disposed to be wrapped by the cylindrical body 40. With reference to FIG. 2 and FIG. 3, which is a cross-sectional view taken along line A-A of FIG. 1, the flange portion 22*f* is a flange-shaped annular member provided around a side surface of the vertical portion 22*a* at the same height as an inner conductor 36*a* of an electromagnetic wave supply path 36 to be perpendicular to the vertical portion 22*a*. The supply path 36 includes an inner conductor 36*a* and an outer conductor 36*b*. The outer conductor 36*b* of the supply path 36 is connected to the sidewall of the cylindrical body 40. The inner conductor 36*a* is connected to the flange portion 22*f*.

Referring to FIGS. 1 to 3, an end portion of the gas pipe 22 (the vertical portion 22*a*) constitutes a small shower head 23 provided with the plurality of gas holes 23*a*. The small shower head 23 is configured to supply the first gas to the first dissociation space 30*b* in the form of a shower through the plurality of gas holes 23*a*. In FIG. 3, the gas holes 23*a* are arranged at equal intervals, one in the center and six in the periphery, but the number and arrangement of the gas holes 23*a* are not limited thereto.

Since the wavelength of the surface waves of the UHF waves in the plasma is about 4 mm to 10 mm, the diameter of the plurality of gas holes 23*a* is 1/16 or less of an effective wavelength λg, for example, 0.6 mm or less. As a result, it is possible to prevent the plasma formed in the first dissociation space 30*b* from returning from the gas holes 23*a* into the gas pipe 22 and consuming unnecessary energy.

The small shower head 23 at the lower end of the gas pipe 22 in FIG. 1 is provided to face a gas introduction port 33*a* in the upper center of the shower head 20. The gas introduction port 33*a* is connected to the diffusion chamber 30*d*.

(Gas Source)

In an embodiment, the plasma processing apparatus 1 includes a $N_2$ gas source 24*a*, a $NF_3$ gas source 24*b*, and a $SiH_4$ gas source 25. The $N_2$ gas source 24*a* is connected to an upper portion of the gas pipe 22. The $N_2$ gas source 24*a* is a gas source for a reducing gas. The $N_2$ gas is an example of the first gas. The $NF_3$ gas source 24*b* is connected to an upper portion of the gas pipe 22. The $NF_3$ gas source 24*b* is a gas source for a cleaning gas. The cleaning gas is an example of the first gas. The cleaning gas may contain a halogen-containing gas. The halogen-containing gas contains, for example, $NF_3$ and/or $Cl_2$. In the present embodiment, the cleaning gas is a $NF_3$ gas, but other gases may be further contained. The cleaning gas may further contain a noble gas such as Ar. The $N_2$ gas source 24*a* is connected to the gas pipe 22 via a valve 29*a*. The $NF_3$ gas source 24*b* is connected to the gas pipe 22 via a valve 29*b*.

The $SiH_4$ gas source 25 is a gas source for a processing gas such as a film-forming gas that directly supplies the second gas to the first dissociation space 30*b*. A side gas pipe 28 penetrates the sidewall of the cylindrical body 40. The $SiH_4$ gas source 25 supplies the second gas to the first dissociation space 30*b* from a gas hole 28*a* provided in the sidewall of the cylindrical body 40 via the side gas pipe 28. The $SiH_4$ gas is an example of the second gas. When the second gas is the film-forming gas, it may contain a silicon-containing gas. The silicon-containing gas may further include other gases in addition to, for example, the silane gas ($SiH_4$). For example, the film-forming gas may further contain a $NH_3$ gas, a $N_2$ gas, a noble gas such as Ar, and the like. The film-forming gas such as a $SiH_4$ gas is a gas that is not desired to be excessively dissociated. Therefore, the second gas may be directly supplied to the shower head 20. On the other hand, the first gas such as the reducing gas ($N_2$ gas) or the $NF_3$ gas is a gas that is desired to be sufficiently dissociated in the first dissociation space 30*b* to supply the active species of the first gas into the chamber 10. Therefore, the first gas is supplied from the upper portion of the gas pipe 22 to the first dissociation space 30*b* via the gas flow path 29 and the small shower head 23. As a result, it is possible to highly dissociate the first gas. The reason will be described later.

(First Dissociation Space)

Normally, in a vacuum space, in order to prevent a node of electromagnetic waves from being formed in the radial direction of the cylindrical body 40, it is necessary to set a diameter R of the inner wall of the cylindrical body 40 to ½ or less of the effective wavelength kg of the surface waves of the electromagnetic waves in vacuum. In contrast, electromagnetic waves (VHF waves and UHF waves) are shortened to about ⅓ of the effective wavelength kg in plasma. Since the first dissociation space 30*b* is a plasma generation space, the diameter R of the inner wall of the cylindrical body 40 is set to be smaller than ⅓ of (λg/2), i.e., λg/6, in order to prevent a node of electromagnetic waves from being formed in the radial direction in the first dissociation space 30*b*. As a result, it is possible to efficiently transmit the energy of electromagnetic waves after eliminating the influence of an antinode or a node.

In the first dissociation space 30*b*, the plasma of the first gas is generated by the electric field of electromagnetic waves. At the time of film formation, the $N_2$ gas and the $SiH_4$ gas are supplied to the first dissociation space 30*b*. The $N_2$ gas is decomposed by the high electric field energy of electromagnetic waves directly under the small shower head 23, and the plasma of the first gas is generated. The $SiH_4$ gas is directly supplied to a region in which the electric field energy of electromagnetic waves of the first dissociation space 30*b* is low. This makes it possible to suppress gas dissociation compared with the $N_2$ gas. At the time of film formation, the valve 29*b* is closed and the valve 29*a* is opened to supply the $N_2$ gas as a reducing gas to the gas pipe 22 and directly supply the second gas to the first dissociation space 30*b*. At the time of cleaning, the valve 29*a* is closed and the valve 29*b* is opened to supply the $NF_3$ gas as a cleaning gas to the gas pipe 22. At the time of cleaning, the second gas is not supplied.

(Resonator: Dielectric Window)

The resonator 100 further includes a dielectric window 21 formed of ceramic or the like. The dielectric window 21 has an annular shape having a hole formed in the center thereof. The end portion of the gas pipe 22 penetrates the hole. An inner periphery of the dielectric window 21 is adjacent to the sidewall at the end portion of the gas pipe 22, and an outer periphery thereof is adjacent to the inner wall of the cylindrical body 40. As a result, the dielectric window 21 is configured to seal a space between the gas pipe 22 and the cylindrical body 40, partition the resonator 100 from the first dissociation space 30*b*, and transmit electromagnetic waves to the first dissociation space 30*b*.

A sealing member 38 such as an O-ring is provided on the sidewall of the gas pipe 22 inside the upper surface of the dielectric window 21. A sealing member 39 such as an O-ring is provided on the sidewall of the cylindrical body 40 outside the lower surface of the dielectric window 21. As a result, the first dissociation space 30*b*, which is a vacuum space, is sealed from the space 26 inside the resonator 100, which is an atmospheric space, so that the airtightness of the first dissociation space 30*b*, which is a vacuum space, is maintained.

(Resonator: Internal Structure and Connection Structure with Respect to Power Supply)

A base end of the supply path 36 of the resonator 100 is connected to the power supply 50 via the matcher 41. The power supply 50 is an electromagnetic wave generator, and is configured to supply electromagnetic waves in the VHF band or higher. The matcher 41 includes an impedance matching circuit. The impedance matching circuit is configured to match an impedance of a load of the power supply 50 with an output impedance of the power supply 50. The impedance matching circuit has a variable impedance. The impedance matching circuit is, for example, a n-type circuit. The electromagnetic waves introduced into the gas activator 2 from the electromagnetic wave supply path 36 resonate in the resonator 100 and are supplied to the first dissociation space 30*b* below the resonator 100 with high energy efficiency.

A dielectric material 31 is embedded in at least a portion of the interior of the resonator 100. In the present embodiment, the interior of the resonator 100 is filled with the dielectric material 31, except for the space 26 inside the resonator 100. Specifically, the dielectric material 31 is filled from directly below the cover conductor 44 in the upper portion of the resonator 100 to the flange portion 22*f*, and between the inner conductor 36*a* and the outer conductor 36*b* of the electromagnetic wave supply path 36. The dielectric material 31 is provided to shorten the wavelength of electromagnetic waves. The resonator 100 is configured to supply electromagnetic waves in the VHF band or higher to the first dissociation space. The dielectric material 31 is, for example, polytetrafluoroethylene (PTFE).

A lower end of the dielectric material 31 may be the same as a position of the lower surface of the flange portion 22*f* in the vertical direction. In addition, the space 26 may also be filled with the dielectric material 31.

[Details of Gas Activator]

A configuration of the gas activator 2 will be further described with reference to FIGS. 2 and 3 in addition to FIG. 1. Below the flange portion 22*f*, a dielectric window 21 that partitions the resonator 100 and the first dissociation space 30*b* is provided. Below the dielectric window 21 is the first dissociation space 30*b*. A space above the dielectric window 21 has atmospheric pressure, and a space below the dielectric window 21 has vacuum pressure. That is, the interior of the resonator 100 has atmospheric pressure, and the interior of the first dissociation space 30*b* has vacuum pressure.

The shape of the first dissociation space 30*b* is a cylindrical body in a cross-sectional view, and the first dissociation space 30*b* has a diameter substantially the same as an inner diameter of the resonator 100.

As indicated by an arrow in FIG. 2, electromagnetic waves (e.g., UHF waves of 500 MHz) propagate in the resonator 100 from the supply path 36. The propagating electromagnetic waves resonate in the resonator 100, pass through the dielectric window 21 and propagate to the first dissociation space 30*b*, function as energy for dissociating the gas directly under the dielectric window 21, and generate plasma of the gas supplied to the first dissociation space 30*b*.

An electric field E is illustrated in FIG. 2. The cylindrical body 40 is configured such that the electric field E of electromagnetic waves becomes the minimum (0 [V]) on the lower surface of the cover conductor 44 inside the resonator 100 and becomes the maximum (Max [V]) on the upper surface of the dielectric window 21. That is, the electromagnetic waves become a node on the lower surface of the cover conductor 44, and the electromagnetic waves become an antinode on the upper surface of the dielectric window 21. By maximizing the electric field on the upper surface of the dielectric window 21 in this way, the plasma ignitability inside the first dissociation space 30*b* is improved, and a state in which the energy efficiency is high is created.

That is, since the electric field E is maximized on the upper surface of the dielectric window 21, the electromagnetic waves resonating in the resonator 100 are supplied to the first dissociation space 30*b* with high energy efficiency. The small shower head 23 is formed in the form of a shower at the tip of the central portion of the gas pipe 22, and is configured to be able to generate plasma P having a high electron density at outlets of the gas holes 23*a* of the small shower head 23. The first gas is plasmarized in the central region of the first dissociation space 30*b* under the small shower head 23 to generate plasma. As a result, plasma P of the first gas in a highly dissociated state is generated in the first dissociation space 30*b*.

When electromagnetic waves having a short wavelength are directly supplied to the shower head 20 and the gas is dissociated in the shower head 20, the plasma tends to be non-uniform. In the present embodiment, the first dissociation space 30*b* is used as a plasma generation space to generate surface wave plasma in the first dissociation space 30*b*, and the first gas is highly dissociated by the electric field of electromagnetic waves.

According to this, the first dissociation space 30*b* is made to function as a plasma generation space, so that the first gas is efficiently and sufficiently dissociated before being supplied to the shower head 20, and then the active species of the first gas are introduced into the shower head 20.

The second dissociation space 30*e* is a process space in which the first gas highly dissociated in the first dissociation space 30*b* is joined with the lowly dissociated (or undissociated) second gas to generate plasma of these gases. In the second dissociation space 30*e*, the first gas and the second gas are dissociated by the radio-frequency waves supplied from the radio-frequency power supply 60.

Figure 4A:
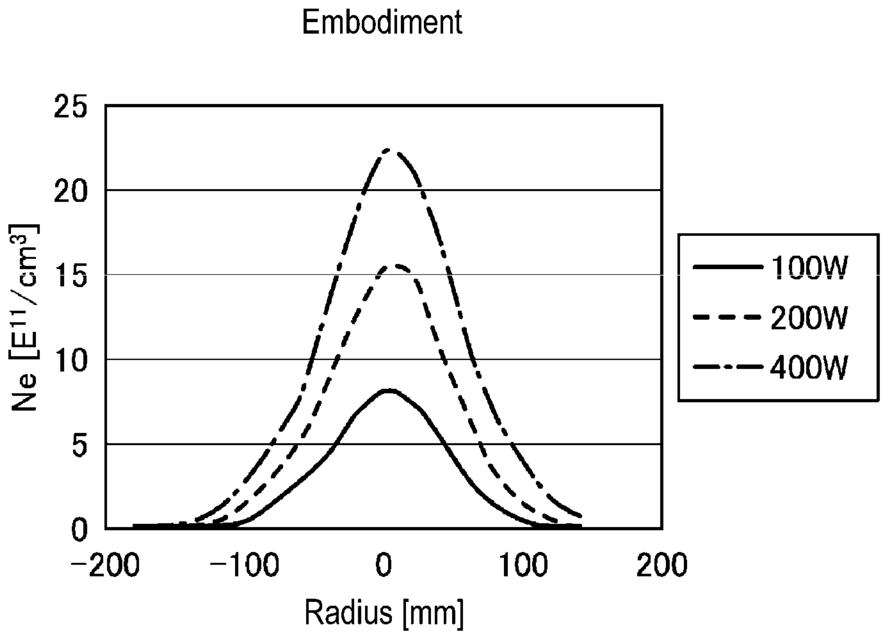
FIGS. 4A and 4B are views each illustrating an example of plasma density.
Figure 4B:
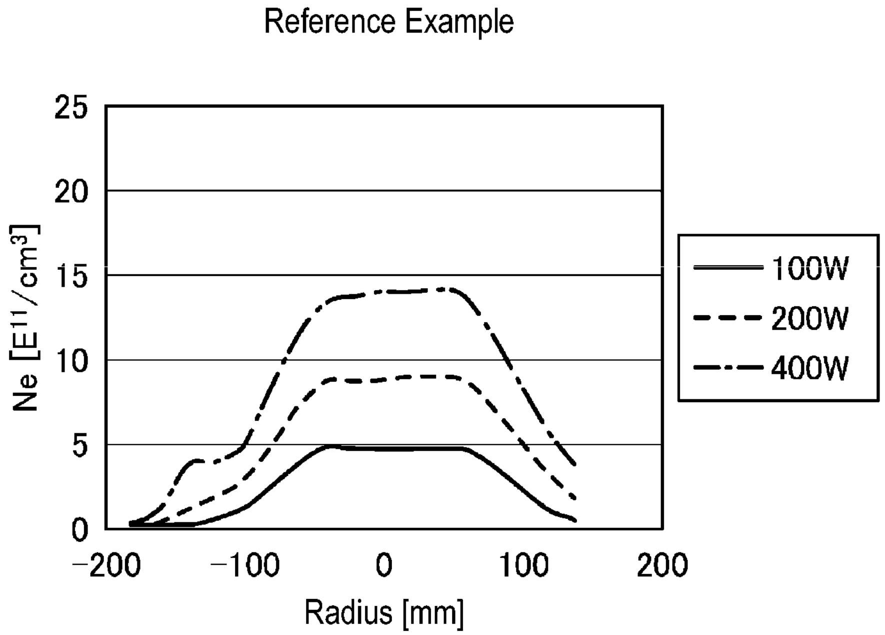

FIGS. 4A and 4B are views each illustrating an example of plasma electron density. In each of FIGS. 4A and 4B, the horizontal axis represents the radius (distance) from the center of the dielectric window with the center of the dielectric window being zero (0), and the vertical axis represents the electron density of plasma generated in the first dissociation space 30*b*. The powers of electromagnetic waves supplied to the first dissociation space 30*b* are 100 W, 200 W, and 400 W.

FIG. 4A shows an electron density (Ne) of plasma generated below the dielectric window 21 according to the present embodiment when the gas is supplied from the center of the shape of the dielectric window 21, that is, an annular shape. FIG. 4B shows an electron density (Ne) generated below a dielectric window according to a reference example when the dielectric window has a disk-like shape.

In the case in which the dielectric window 21 has an annular shape, a plasma sheath is also formed on a metal portion of the lower surface (the surface where the gas holes 23*a* open) of the small shower head 23 disposed in the central portion. As a result, the surface waves of electromagnetic waves are able to propagate inside the plasma sheath of the metal portion. In such a state, the electromagnetic waves are collected from the dielectric window 21 disposed in the periphery to the lower surface of the small shower head 23 in the central portion. Therefore, energy is concentrated at the center of the annular dielectric window 21 and the electric field becomes high.

As a result, when plasma is generated below the annular dielectric window 21, the electron density (Ne) of plasma in the central portion of the dielectric window 21 becomes the highest as shown in FIG. 4A. In contrast, when plasma is generated below the disk-shaped dielectric window, energy is dispersed over the entire surface of the dielectric window. Therefore, as shown in FIG. 4B, the electron density of plasma in the central portion of the dielectric window is lower than that in the case of the present embodiment of FIG. 4B, and the top of the plasma electron density becomes flat.

Therefore, according to the shape of the dielectric window 21 according to the present embodiment, it is possible to highly dissociate the gas efficiently by causing the first gas to flow from the small shower head 23 to the central portion of the first dissociation space 30*b*, and plasmarizing the gas in the central portion having high energy.

Returning back to FIG. 2, the surface (lower surface) of the dielectric window 21 exposed to the first dissociation space 30*b* has an annular recess 21*a*. By reducing a thickness of the dielectric window 21, it is possible to make it difficult for electromagnetic waves to pass through the recess 21*a*. This makes it possible to further strengthen the electric field when the surface waves of the electromagnetic waves pass through the sheath of the metal portion of the small shower head 23, and to generate plasma having a higher density. However, the recess 21*a* may not be provided on the lower surface of the dielectric window 21, and the shape of the lower surface may be flat.

In order to prevent the electric field from being transmitted to a metal portion on the side surface of the small shower head 23, a side surface 21*b* of the recess 21*a* is provided up to the end portion of the small shower head 23 along the small shower head 23 so as to protect the sidewall of the small shower head 23. A side surface 21*c* of the recess 21*a* is provided along a protrusion 40*a* of the cylindrical body 40 up to the end of the protrusion 40*a* so as to protect the protrusion 40*a* of the cylindrical body 40.

In the plasma processing apparatus 1 described above, the first dissociation space 30*b* as a plasma generation space is provided on the upstream side of the shower head 20. Further, the first gas is dissociated in the first dissociation space 30*b*, and the active species of the gas such as the generated radicals are supplied to the second dissociation space 30*e* through the shower head 20. Since the first gas that has reached the second dissociation space 30*e* is in a recombined excited state, it is easy to redissociate the first gas by radio-frequency energy having a lower frequency than electromagnetic waves in the VHF band or higher. As a result, it is possible to improve the uniformity of a plasma process by using highly efficient radical generation capability which is a characteristic of electromagnetic waves of the VHF band or higher, while avoiding the non-uniformity of the plasma process due to the short wavelength of electromagnetic waves of the VHF band and higher.

As described above, according to the plasma processing apparatus of the present embodiment, it is possible to improve the uniformity of the plasma process.

It should be understood that the plasma processing apparatus according to the embodiments disclosed herein is exemplary in all respects and not restrictive. The embodiments may be modified and improved in various forms without departing from the scope and spirit of the appended claims. The matters described in the above embodiments may take other configurations to the extent they are not contradictory, and may be combined to the extent they are not contradictory.

What is claimed is:

1. A plasma processing apparatus comprising:

a processing container including a substrate support provided therein;

a shower head configured to supply active species of a first gas into the processing container;

a first dissociation space configured such that the active species of the first gas is plasmarized;

a second dissociation space provided in the processing container separately from the first dissociation space, and configured such that the active species of the first gas plasmarized in the first dissociation space is supplied to the shower head to be additionally plasmarized; and a resonator configured to supply electromagnetic waves in a VHF band or higher to the first dissociation space, wherein the resonator includes:

a cylindrical body that constitutes a housing of the resonator;

a gas pipe which passes through an interior of the cylindrical body, is provided along a central axis direction of the cylindrical body, includes a plurality of gas holes formed in an end portion of the gas pipe, and is configured to supply the first gas into the first dissociation space through the plurality of gas holes; and a dielectric window including a central portion through which the end portion of the gas pipe passes, and configured to seal a space between the gas pipe and the cylindrical body and cause the electromagnetic waves to transmit through the first dissociation space.

2. The plasma processing apparatus of claim 1, wherein the electromagnetic waves are in a UHF band or higher.

3. The plasma processing apparatus of claim 2, wherein radio-frequency waves are applied to at least one of the shower head and the substrate support to generate plasma of a gas containing the active species of the first gas supplied into the processing container.

4. The plasma processing apparatus of claim 3, wherein a surface of the dielectric window exposed to the first dissociation space includes an annular recess.

5. The plasma processing apparatus of claim 4, wherein the first dissociation space has a cylindrical shape, and has a diameter smaller than 1/6 of a wavelength λg of surface waves of the electromagnetic waves.

6. The plasma processing apparatus of claim 5, wherein each of the plurality of gas holes has a diameter of 1/16 or less of a wavelength λg of surface waves of the electromagnetic waves.

7. The plasma processing apparatus of claim 6, wherein the gas pipe penetrates an interior of the resonator.

8. The plasma processing apparatus of claim 7, further comprising:

a side gas pipe provided in the cylindrical body and configured to supply a second gas into the first dissociation space from a sidewall of the cylindrical body.

9. The plasma processing apparatus of claim 8, wherein an interior of the resonator has an atmospheric pressure, and the first dissociation space has a vacuum pressure.

10. The plasma processing apparatus of claim 9, wherein the first dissociation space is provided between the resonator and the shower head.

11. The plasma processing apparatus of claim 10, wherein a dielectric material is embedded in at least a portion of the resonator.

12. The plasma processing apparatus of claim 11, wherein an upper end surface of the resonator is configured such that an electric field of the electromagnetic waves is minimized, and the gas pipe configured to supply the first gas penetrates the upper end surface of the resonator.

13. The plasma processing apparatus of claim 12, wherein an upper surface of the dielectric window is configured such that an electric field of the electromagnetic waves is maximized.

14. The plasma processing apparatus of claim 1, wherein radio-frequency waves are applied to at least one of the shower head and the substrate support to generate plasma of a gas containing the active species of the first gas supplied into the processing container.

15. The plasma processing apparatus of claim 1, wherein a surface of the dielectric window exposed to the first dissociation space includes an annular recess.

16. The plasma processing apparatus of claim 1, wherein the first dissociation space has a cylindrical shape, and has a diameter smaller than 1/6 of a wavelength λg of surface waves of the electromagnetic waves.

17. The plasma processing apparatus of claim 1, wherein each of the plurality of gas holes has a diameter of 1/16 or less of a wavelength λg of surface waves of the electromagnetic waves.

18. The plasma processing apparatus of claim 1, wherein the gas pipe penetrates an interior of the resonator.

19. The plasma processing apparatus of claim 1, further comprising:

a side gas pipe provided in the cylindrical body and configured to supply a second gas into the first dissociation space from a sidewall of the cylindrical body.

20. The plasma processing apparatus of claim 1, wherein an interior of the resonator has an atmospheric pressure, and the first dissociation space has a vacuum pressure.

* * * * *